United States Patent
Chen et al.

(10) Patent No.: US 8,574,992 B2
(45) Date of Patent: Nov. 5, 2013

(54) CONTACT ARCHITECTURE FOR 3D MEMORY ARRAY

(75) Inventors: Shih-Hung Chen, Hsinchu (TW); Yen-Hao Shih, Elmsford, NY (US); Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 34 days.

(21) Appl. No.: 13/240,568

(22) Filed: Sep. 22, 2011

(65) Prior Publication Data

US 2013/0075802 A1    Mar. 28, 2013

(51) Int. Cl.
*H01L 21/336* (2006.01)
*G11C 5/06* (2006.01)

(52) U.S. Cl.
USPC .... 438/288; 438/257; 257/314; 257/E21.662; 257/E21.68; 365/63; 365/148

(58) Field of Classification Search
USPC .................................................. 257/E21.68
See application file for complete search history.

(56) References Cited

U.S. PATENT DOCUMENTS

| | | | | |
|---|---|---|---|---|
| 5,891,805 | A * | 4/1999 | Cheng et al. ........... | 438/696 |
| 6,034,882 | A | 3/2000 | Johnson et al. | |
| 6,646,912 | B2 * | 11/2003 | Hurst et al. ........... | 365/175 |
| 6,817,531 | B2 * | 11/2004 | Taussig et al. ........ | 235/492 |
| 6,906,361 | B2 | 6/2005 | Zhang | |
| 6,906,940 | B1 | 6/2005 | Lue | |
| 7,081,377 | B2 | 7/2006 | Cleeves | |
| 7,129,538 | B2 | 10/2006 | Lee et al. | |
| 7,177,169 | B2 * | 2/2007 | Scheuerlein ........... | 365/51 |
| 7,274,594 | B2 | 9/2007 | Pascucci et al. | |
| 7,315,474 | B2 | 1/2008 | Lue | |
| 7,382,647 | B1 | 6/2008 | Gopalakrishnan | |
| 7,420,242 | B2 | 9/2008 | Lung | |
| 7,851,849 | B2 | 12/2010 | Kiyotoshi | |
| 2005/0280061 | A1 | 12/2005 | Lee | |
| 2007/0140001 | A1 | 6/2007 | Motoi et al. | |
| 2008/0073635 | A1 | 3/2008 | Kiyotoshi et al. | |
| 2008/0096327 | A1 | 4/2008 | Lee et al. | |

(Continued)

FOREIGN PATENT DOCUMENTS

| | | |
|---|---|---|
| EP | 1936681 A1 | 6/2008 |
| EP | 2048709 A2 | 4/2009 |

OTHER PUBLICATIONS

U.S. Appl. No. 12/114,931, filed May 24, 2011, "Multilayer Connection Structure and Making Method,".

(Continued)

*Primary Examiner* — Evan Pert
*Assistant Examiner* — Joseph Galvin, III
(74) *Attorney, Agent, or Firm* — Kenta Suzue; Haynes Beffel & Wolfeld LLP (57) ABSTRACT

A vertical interconnect architecture for a three-dimensional (3D) memory device suitable for low cost, high yield manufacturing is described. Conductive lines (e.g. word lines) for the 3D memory array, and contact pads for vertical connectors used for couple the array to decoding circuitry and the like, are formed as parts of the same patterned level of material. The same material layer can be used to form the contact pads and the conductive access lines by an etch process using a single mask. By forming the contact pads concurrently with the conductive lines, the patterned material of the contact pads can protect underlying circuit elements which could otherwise be damaged during patterning of the conductive lines.

26 Claims, 12 Drawing Sheets

(56) References Cited

U.S. PATENT DOCUMENTS

| | | | |
|---|---|---|---|
| 2008/0101109 A1 | 5/2008 | Haring-Bolivar et al. | |
| 2008/0128853 A1* | 6/2008 | Choi et al. | 257/530 |
| 2008/0180994 A1 | 7/2008 | Katsumata et al. | |
| 2008/0247230 A1 | 10/2008 | Lee et al. | |
| 2009/0097321 A1* | 4/2009 | Kim et al. | 365/185.18 |
| 2009/0184360 A1 | 7/2009 | Jin et al. | |
| 2010/0265773 A1* | 10/2010 | Lung et al. | 365/185.27 |
| 2010/0270593 A1 | 10/2010 | Lung et al. | |

OTHER PUBLICATIONS

U.S. Appl. No. 13/245,587, filed Sep. 26, 2011, "Architecture for a 3-D Memory Array,".

U.S. Appl. No. 13/078,311, filed Apr. 1, 2011, "Memory Architecture of 3d Array with Alternating Memory String Orientation and String Select Structures,".

Soon-Moon Jung et al. "Three Dimensionally Stacked NAND Flash Memory Technology Using Stacking Single Crystal Si Layers on ILD and TANOS Structure for Beyond 30nm Node," Electron Devices Meeting, 2006, IEDM International, Dec. 11-13, 2006, pp. 1-4.

Mark Johnson et al. "512-Mb PROM With a Three-Dimensional Array of Diode/Antifuse Memory Cells," IEEE Journal of Solid-State Circuits, vol. 38, No. 11, Nov. 2003, pp. 1920-1928.

Erh-Kun Lai et al. "A Multi-Layer Stackable Thin-Film Transistor (TFT) Nand-Type Flash Memory," 2006 IEEE, pp. 1-4.

Jiyoung Kim et al., Novel 3-D Structure for Ultra High Density Flash Memory with VRAT (Vertical-Recess-Array-Transistor) and PIPE (Planarized Integration on the same PlanE), 2008 Symposium on VLSI Technology Digest of Technical Papers, pp. 122-123.

H. Tanaka et al. "Bit Cost Scalable Technology with Punch and Plug Process for Ultra High Density Flash Memory," Jun. 12-14, 2007, Symposium on VLSI Technology Digest of Technical Papers, pp. 14-15.

Tzu-Hsuan Hsu et al. "Study of Sub-30nm Thin Film Transistor (TFT) Charge-Trapping (CT) Devices for 3D NAND Flash Application," IEEE 2009, pp. 27.4.1-27.4.4.

A. Hubert et al. "A Stacked SONOS Technology, Up to 4 Levels and 6nm Crystalline Nanowires, With Gate-All-Around or Independent Gates (Flash), Suitable for Full 3D Integration," IEDM 2009, pp. 27.6.1-27.6.4.

Hang-Ting Lue et al. "A Novel Buried-Channel FinFET BE-SONOS NAND Flash with Improved Memory Window and Cycling Endurance," 2009 Symposium on VLSI Technology Digest of Technical Papers, pp. 224-225.

Wonjoo Kim et al. "Multi-Layered Vertical Gate NAND Flash Overcoming Stacking Limit for Terabit Density Storage," 2009 Symposium on VLSI Technology Digest of Technical Papers, pp. 188-189.

Jaehoon Jang et al. "Vertical Cell Array Using TCAT (Terabit Cell Array Transistor) Technology for Ultra High Density NAND Flash Memory," 2009 Symposium on VLSI Technology Digest of Technical Papers, pp. 192-193.

Ryota Katsumata et al. "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Bipul C. Paul et al. "Impact of a Process Variation on Nanowire and Nanotube Device Performance," IEEE Transactions on Electron Devices, vol. 54, No. 9, Sep. 2007, pp. 2369-2376.

Sung-Jin Choi et al. "Performance Breakthrough in NOR Flash Memory With Dopant-Segregated Schottky-Barrier (DSSB) SONOS Devices," 2009 Symposium on VLSI Technology Digest of Technical Papers, pp. 222-223.

Sheng-Chih Lai et al. "Highly Reliable MA BE-SONOS (Metal-Al2O3 Bandgap Engineered SONOS) Using a SiO2 Buffer Layer," VLSI Technology, Systems and Applications 2008, VLSI-TSA International Symposium on Apr. 21-23, 2008, pp. 58-59.

Yoshiaki Fukuzumi et al. "Optimal Integration and Characteristics of Vertical Array Devices for Ultra-High Density, Bit-Cost Scalable Flash Memory," IEEE 2007, pp. 449-452.

Jiyoung Kim et al. "Novel Vertical-Stacked-Array-Transistor (VSAT) for Ultra-High-Density and Cost-Effective NAND Flash Memory Devices and SSD (Solid State Drive)", 2009 Symposium on VLSI Technology Digest of Technical Papers, pp. 186-187.

* cited by examiner

CONTACT ARCHITECTURE FOR 3D MEMORY ARRAY

CROSS-REFERENCE TO RELATED APPLICATIONS

This application is related to U.S. patent application Ser. No. 13/114,931 filed 24 May 2011, entitled "Multilayer Connection Structure and Making Method," and to U.S. patent application Ser. No. 13/245,587 filed Sep. 26, 2011 entitled "Architecture for a 3-D Memory Array;".

BACKGROUND

1. Field of the Invention

The present invention relates generally to high density integrated circuit devices, and more particularly to interconnect structures for multi-level three-dimensional stacked devices.

2. Description of Related Art

As critical dimensions of devices in integrated circuits shrink to the limits of common memory cell technologies, designers have been looking for techniques for stacking multiple levels of memory cells to achieve greater storage capacity, and to achieve lower costs per bit. For example, thin film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006.

Also, cross-point array techniques have been applied for anti-fuse memory in Johnson et al., multiple layers of word lines and bit lines are provided, with memory elements at the cross-points. The memory elements comprise a p+ polysilicon anode connected to a word line, and an n-polysilicon cathode connected to a bit line, with the anode and cathode separated by anti-fuse material.

Another structure that provides vertical NAND cells in a charge trapping memory technology is described in "Novel 3-D Structure for Ultra-High Density Flash Memory with VRAT and PIPE" by Kim et al., 2008 Symposium on VLSI Technology Digest of Technical Papers"; 17-19 Jun. 2008; pages 122-123.

In three-dimensional stacked memory structures, vertical interconnects couple various circuit structures of the array to overlying access lines, such as global bit lines and source lines, used for reading and writing the memory cells.

One drawback of conventional three-dimensional stacked memory devices is that the vertical interconnect structures to different portions in the array are formed separately in different levels overlying the array. This requires the creation of a lithographic mask for each level and an etching step for each level. The cost to implement the vertical interconnects increases with the number of lithographic steps needed. In addition, issues such as mask alignment and etch selectivity during manufacturing can reduce yield.

It is desirable to provide a structure for three-dimensional integrated circuit memory with a low manufacturing cost, and high yield.

SUMMARY

A vertical interconnect architecture for a three-dimensional (3D) memory device suitable for low cost, high yield manufacturing is described. Conductive lines (e.g. word lines) for the 3D memory array, and contact pads for vertical connectors used for couple the array to decoding circuitry and the like, are formed as parts of the same patterned level of material. The same material layer can be used to form the contact pads and the conductive access lines by an etch process using a single mask. By forming the contact pads concurrently with the conductive lines, the patterned material of the contact pads can protect underlying circuit elements which could otherwise be damaged during patterning of the conductive lines.

The contact pads provide a vertical interconnection interface for the 3D memory array. Conductive contacts can then be formed within a dielectric fill to contact corresponding contact pads. Additional back-end-of-line (BEOL) processing can then be performed to complete the 3D memory device.

Other aspects and advantages of the present invention can be seen on review of the drawings, the detailed description, and the claims which follow.

DETAILED DESCRIPTION

A detailed description of embodiments of the present invention is provided with reference to the FIGS. 1-11.

Figures 1A, 1B:
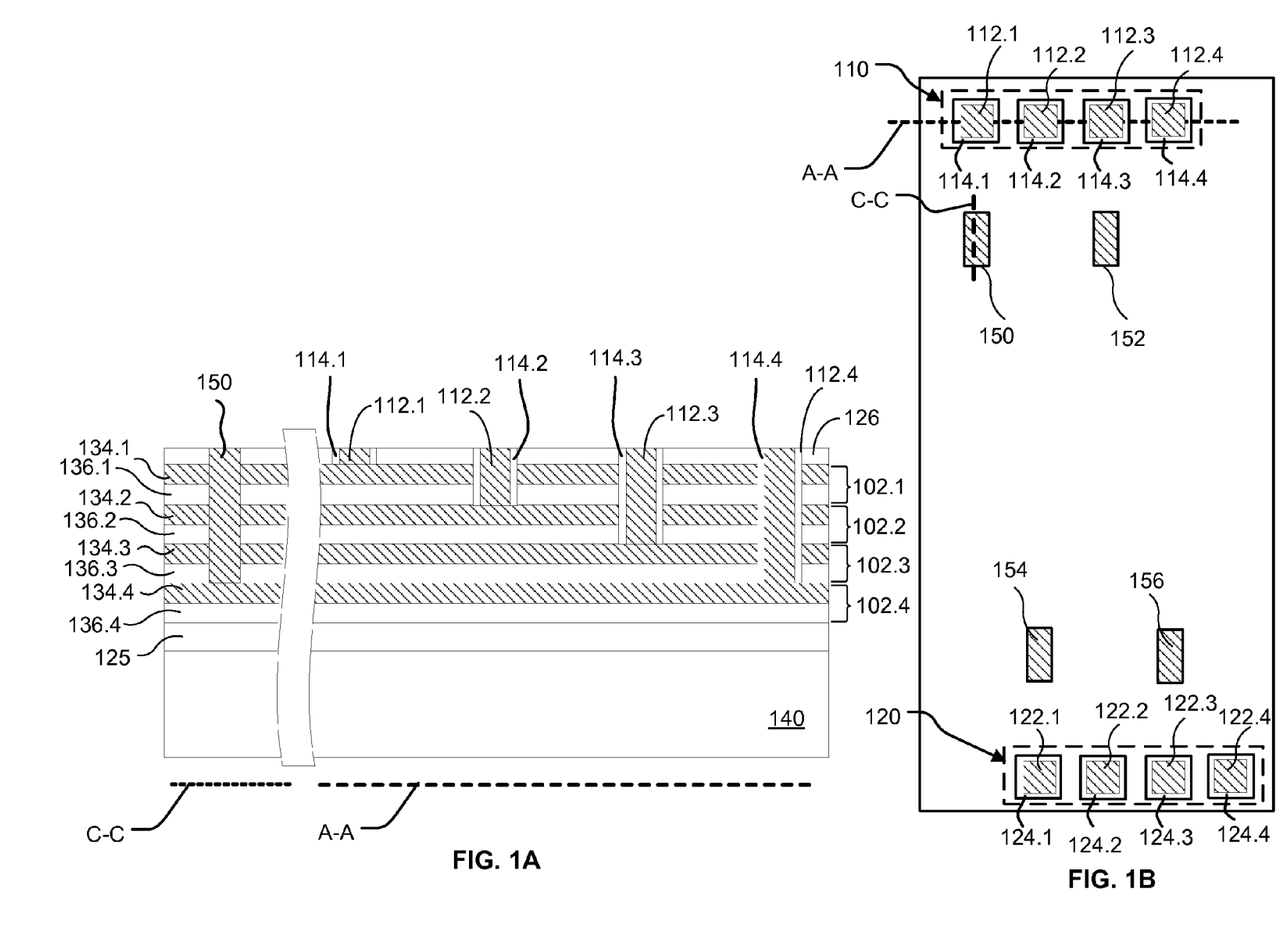
FIGS. 1A and 1B illustrate cross-sectional and top views of a structure following a first stage in a process for manufacturing a three-dimensional stacked memory device.

FIGS. 1A and 1B illustrate cross-sectional and top views of a structure following a first stage in a process for manufacturing a three-dimensional stacked memory device. In this example, four levels 102, labeled 102.1, 102.2, 102.3, 102.4, are illustrated, which is representative of a structure that can include many levels.

The four levels 102 are separated from an underlying semiconductor substrate 140 by one or more dielectric layers 125. A top dielectric layer 126 overlies the four levels 102.

The levels 102 include respective layers 134 of conductive material. In the illustrated example, the layers 134 are semiconductor material such as doped polysilicon. The levels 102 also include respective layers 136 of insulating material separating the semiconductor material layers 134 of the different levels 102.

The structure also includes a first stepped connector structure 110. The first stepped connector structure 110 includes conductive vertical connectors 112, labeled 112.1-112.4, each electrically connected to one of the conductive layers 134 of one of the levels 102. The vertical connectors 112 are surrounded by corresponding dielectric sidewall spacers 114, labeled 114.1-114.4. The dielectric sidewall spacers 114 electrically isolate the corresponding vertical connectors 112 from the conductive layers 134 of the other levels 102 with which the vertical connectors 112 are not to make electrical contact.

FIG. 1A includes a cross-sectional view through the first stepped conductor structure 110 along line A-A. As shown in FIG. 1A, vertical connector 112.1 extends through dielectric layer 126 to contact the conductive layer 134.1 of first level 102.1. Similarly, vertical connector 114.2 is electrically connected to conductive layer 134.2 of second level 102.2, vertical connector 114.3 is electrically connected to conductive layer 134.3 of third level 102.3, and vertical connector 114.4 is electrically connected to conductive layer 134.4 of fourth level 102.4.

As shown in the top view of FIG. 1B, the structure also includes a second stepped conductor structure 120. The second stepped conductor structure 120 includes vertical connectors 122, labeled 122.1-122.4, electrically connected to one of the conductive layers 134 of one of the levels 102. The vertical connectors 122 are surrounded by corresponding dielectric sidewall spacers 124, labeled 124.1-124.4. The dielectric sidewall spacers 124 electrically isolate the vertical connectors 122 from the conductive layers 134 of the other levels 102 with which the vertical connectors 122 are not to make electrical contact.

The structure also includes vertical connectors 150, 152, 154, 156 electrically connected to each conductive layer 134 of each of the levels 102. FIG. 1A includes a cross-sectional view through the vertical connector 150 taken along line C-C. As shown in FIG. 1A, the vertical connector 150 is electrically connected to the conductive levels 134.1, 134.2, 134.3, 134.4 of each of the levels 102.1, 102.2, 102.3, 102.4.

The structure illustrated in FIGS. 1A and 1B can be manufactured utilizing the techniques described in U.S. patent application Ser. No. 13/114,931 filed 24 May 2011, which is incorporated by reference herein as if fully set forth herein.

Figures 2A, 2B:
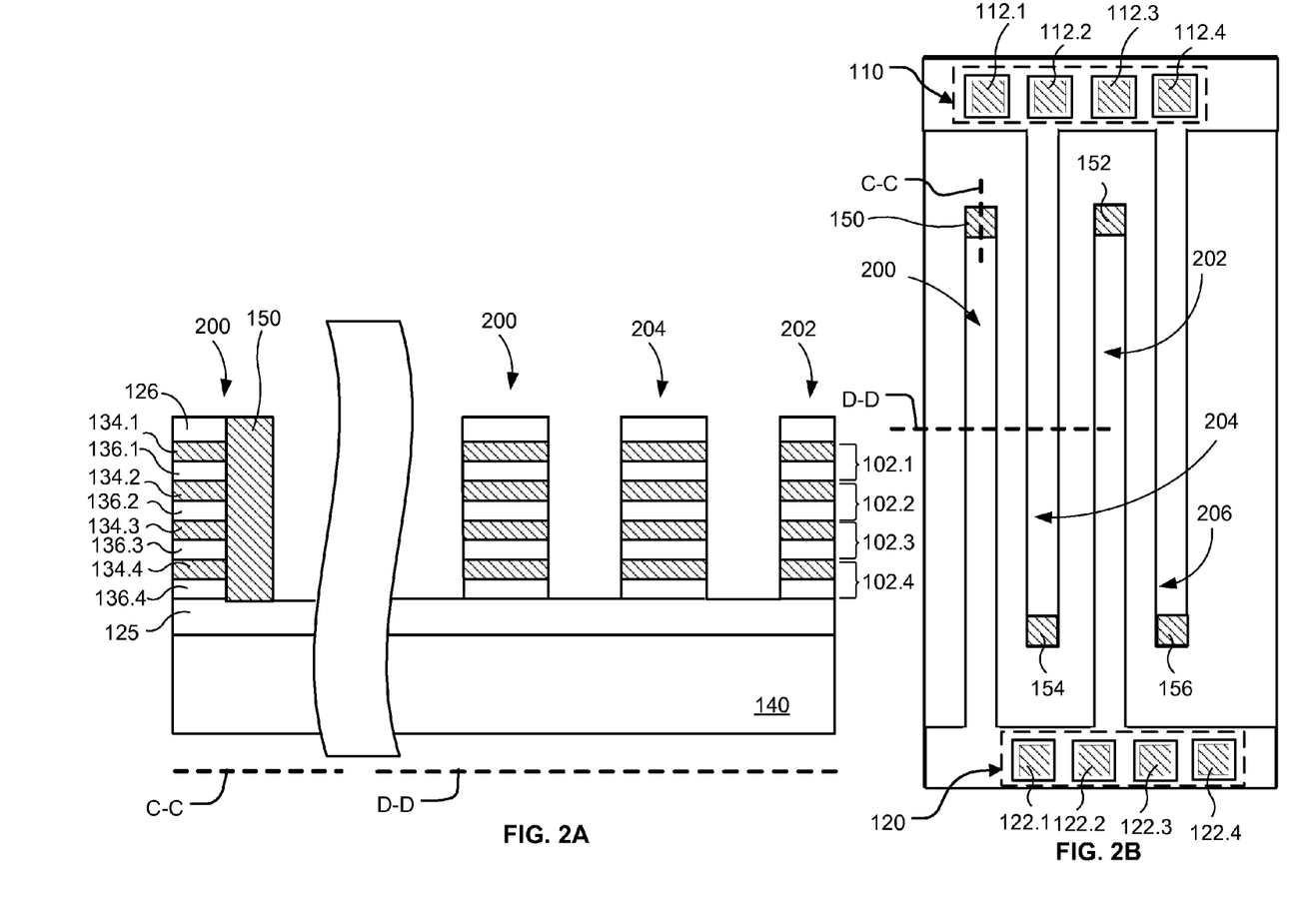
FIGS. 2A and 2B illustrate cross-sectional and top views of a structure following a second stage in a process for manufacturing a three-dimensional stacked memory device.

FIGS. 2A and 2B illustrate top and cross-sectional views of the structure of FIGS. 1A and 1B after performing a lithographic patterning step to define a plurality of ridge-shaped stacks 200, 202, 204, 206 of semiconductor strips. The semiconductor strips are implemented using the material of the conductive layers 134, and are separated from other strips in the same stack by the insulating material of the layers 136. As described in more detail below, the conductive strips of the stacks 200, 202, 204, 206 act as local bit lines in the various levels 102 of the device.

The lithographic patterning step is carried out by forming a patterned photoresist mask on selected areas of the structure 100 illustrated in FIGS. 1A and 1B. Etching is then performed down to the dielectric layer 125 using the photoresist mask as an etch mask. The photoresist mask is then removed, resulting in the structure illustrated in FIGS. 2A and 2B.

As shown in FIGS. 2A and 2B, the lithographic patterning step is carried out such that the vertical connectors 150, 152, 154, 156 are arranged at first ends of the stacks 200, 202, 204, 206 of semiconductor strips. This patterning process also exposes the sidewall surfaces of the vertical connectors 150, 152, 154, 156.

The vertical connector at the first end of a particular stack interconnects the conductive strips of that particular stack. For example, FIG. 2A includes a cross-sectional view along line C-C through the vertical connector 150 arranged at the first end of the stack 200. As shown in FIG. 2A, the vertical connector 150 is connected to the semiconductor strips in the various levels 102 of the stack 200.

The stacks 200, 202 are collectively referred to herein as a first set of stacks. The stacks 204, 206 are collectively referred to herein as a second set of stacks. As can be seen in FIG. 2B, the first and second sets of stacks have opposite orientations. That is, the vertical connectors 150, 152 at the first ends of the stacks 200, 202 in the first set are opposite the vertical connectors at the first ends of the stacks 204, 206 in the second set. In addition, the first and second sets of stacks are arranged in an alternating fashion, so that adjacent stacks in the first set are separated by a single stack in the second set, and adjacent stacks in the second set are separated by a single stack in the first set.

Conductive extensions (not shown) within the levels 102 are patterned at the same time that the stacks 200, 202, 204, 206 are defined. First conductive extensions within the levels 102 are arranged at second ends of the stacks 204, 206. The first conductive extensions are implemented using the material of the conductive layers 134 of the various levels 102. The first conductive extensions couple the conductive strips of the stacks 204, 206 within the same level to one another and to a corresponding vertical connector 112 in the first stepped connector structure 110. For example, a first conductive extension in the first level 102.1 couples the conductive strips of the stacks 204, 206 in the first level 102.1 to one another and to the corresponding vertical connector 122.1 for the first level 102.1

The patterning step also forms second conductive extensions (not shown) at second ends of the stacks 200, 202. The second conductive extensions are implemented using the material of the conductive layers 134 of the various levels 102. The second conductive extensions couple the conductive strips of the stacks 200, 202 within the same level to one another and to a corresponding vertical connector 122 in the second stepped connector structure 120. For example, a second conductive extension in the first level 102.1 couples the conductive strips of the stacks 200, 202 in the first level 102.1 to one another and to the corresponding vertical connector 122.1 for the first level 102.1.

Figures 3A, 3B:
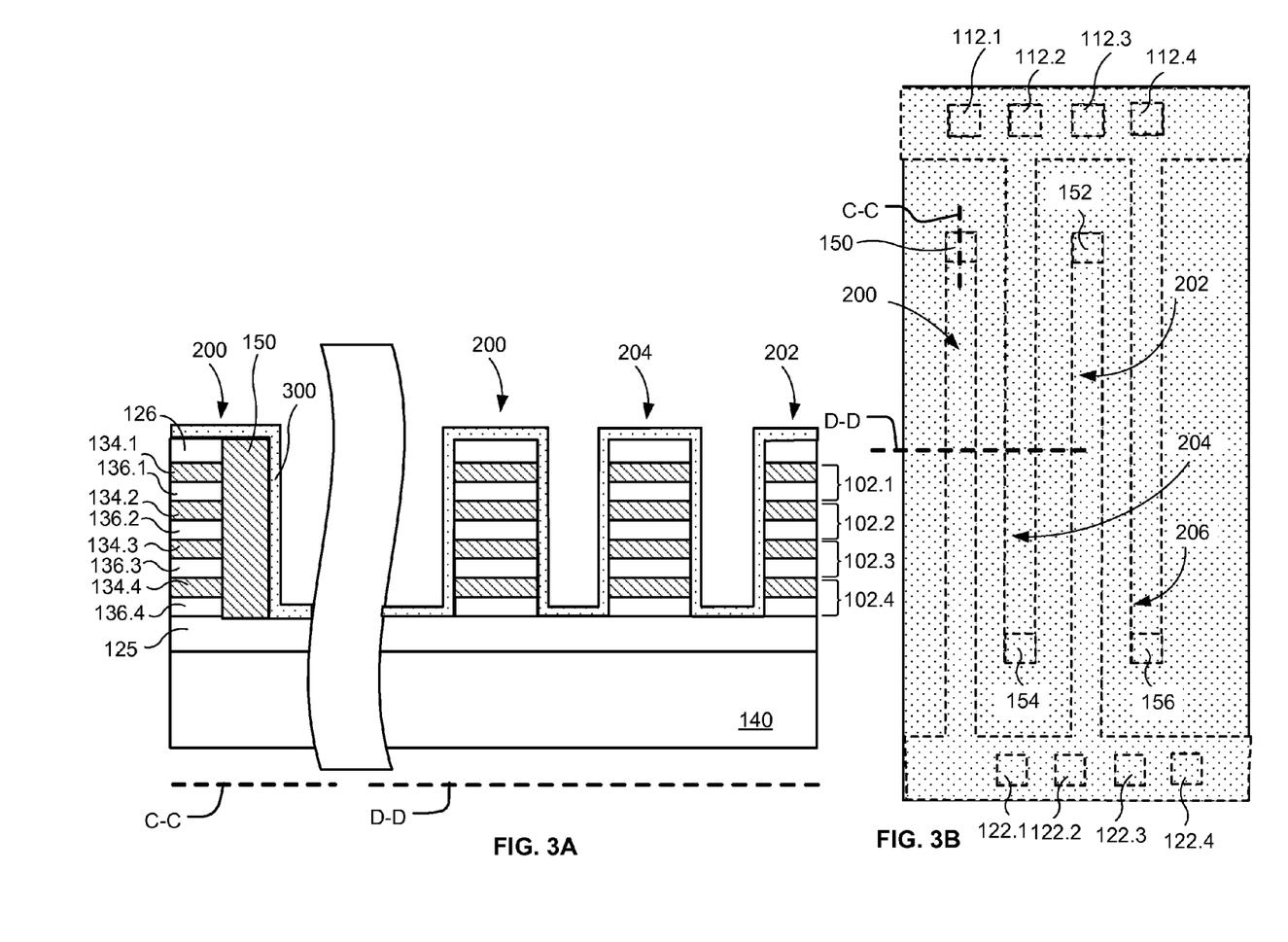
FIGS. 3A and 3B illustrate cross-sectional and top views of a structure following a third stage in a process for manufacturing a three-dimensional stacked memory device.

FIGS. 3A and 3B illustrate top and cross-sectional views after blanket deposition of a memory layer 300 on the structure illustrated in FIGS. 2A and 2B.

The memory layer 300 may for example be a programmable resistance memory material. For example, the memory layer 300 may consist of a single layer of anti-fuse material. The anti-fuse material may be for example silicon dioxide, silicon nitride, silicon oxynitride or other silicon oxide. Alternatively other types of programmable resistance memory materials may be formed.

In an alternative, rather than a blanket deposition, an oxidation process can be applied to form oxides on the exposed sides of the conductive strips of the stacks, where the oxides act as the memory material.

The memory layer 300 may alternatively comprise a multilayer charge trapping structure including a tunneling layer, a charge trapping layer and a blocking layer. In one embodiment, the tunneling layer silicon oxide (O), the charge storage layer is silicon nitride (N), and the blocking layer is silicon oxide (O). Alternatively, the multilayer charge trapping structure may comprise other charge storage structures, including for example silicon oxynitride ($Si_xO_yN_z$), silicon-rich nitride, silicon-rich oxide, trapping layers including embedded nanoparticles and so on.

In one embodiment, a bandgap engineered SONOS (BE-SONOS) charge storage structure can be used which includes a dielectric tunneling layer that includes a combination of materials forming an inverted "U" shaped valence band under zero bias. In one embodiment, the composite tunneling dielectric layer includes a first layer referred to as a hole tunneling layer, a second layer referred to as a band offset layer, and a third layer referred to as an isolation layer.

Figure 4A:
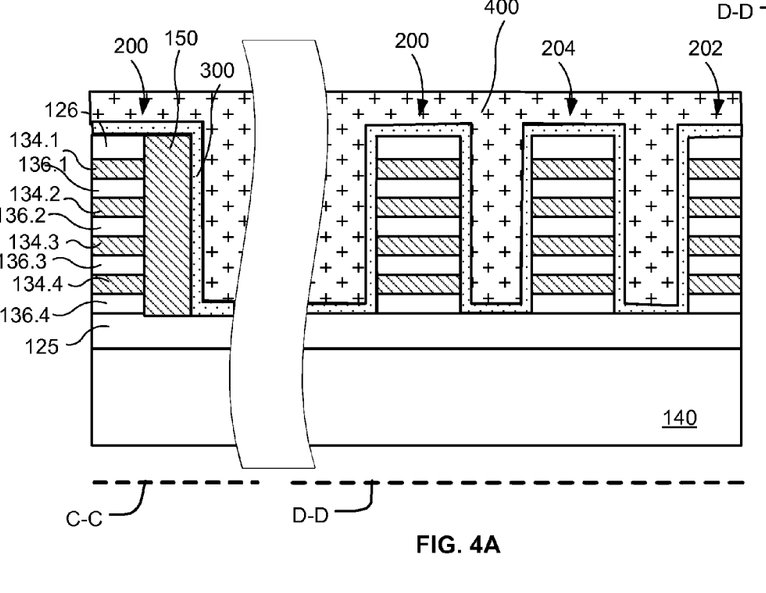
FIGS. 4A and 4B illustrate cross-sectional and top views of a structure following a fourth stage in a process for manufacturing a three-dimensional stacked memory device.
Figure 4B:
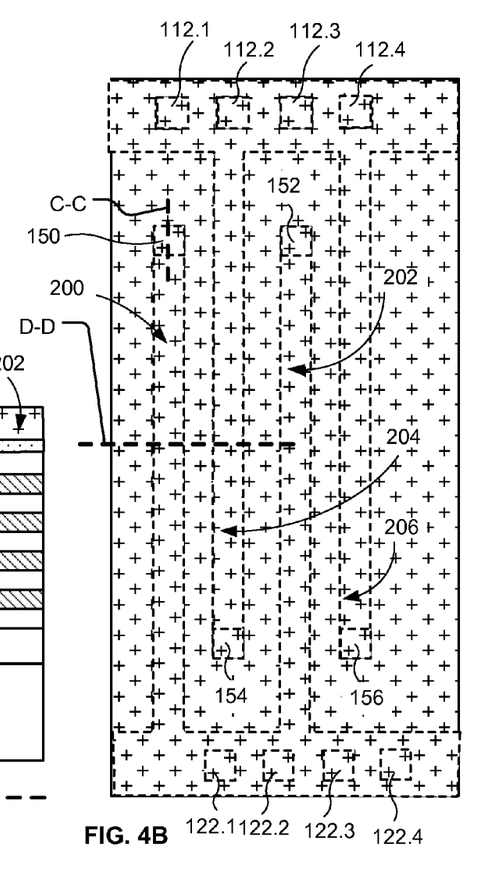

FIGS. 4A and 4B show the results of depositing a layer 400 of conductive material, such as polysilicon having n-type or p-type doping, on the structure illustrated in FIGS. 3A and 3B. As described below, the material of layer 400 is used as the lower portion of conductive lines which will act as word lines for the device. A high aspect ratio deposition technology such as low-pressure chemical vapor deposition of polysilicon can be utilized to completely fill the open regions or trenches between the ridge-shaped stacks 200, 202, 204, 206.

Figure 5A:
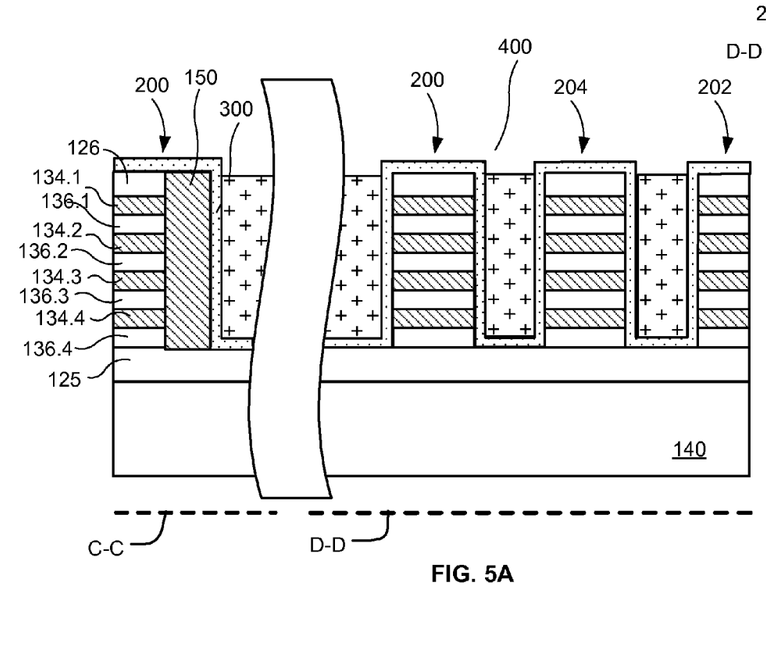
FIGS. 5A and 5B illustrate cross-sectional and top views of a structure following a fifth stage in a process for manufacturing a three-dimensional stacked memory device.
Figure 5B:
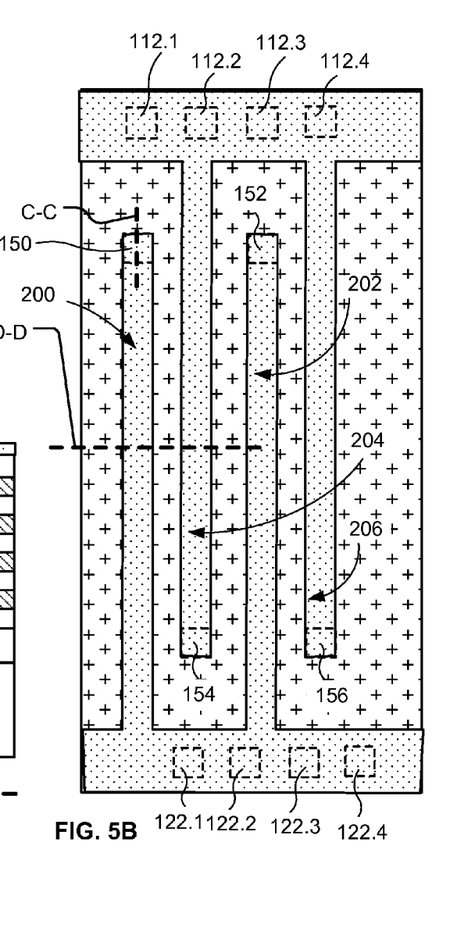

FIGS. 5A and 5B show the results of etching back of the layer 400 to expose portions of the memory layer 300 above the top surfaces of the stacks 200, 202, 204, 206, and above the top surfaces of the vertical connectors 112, 122.

Figure 6A:
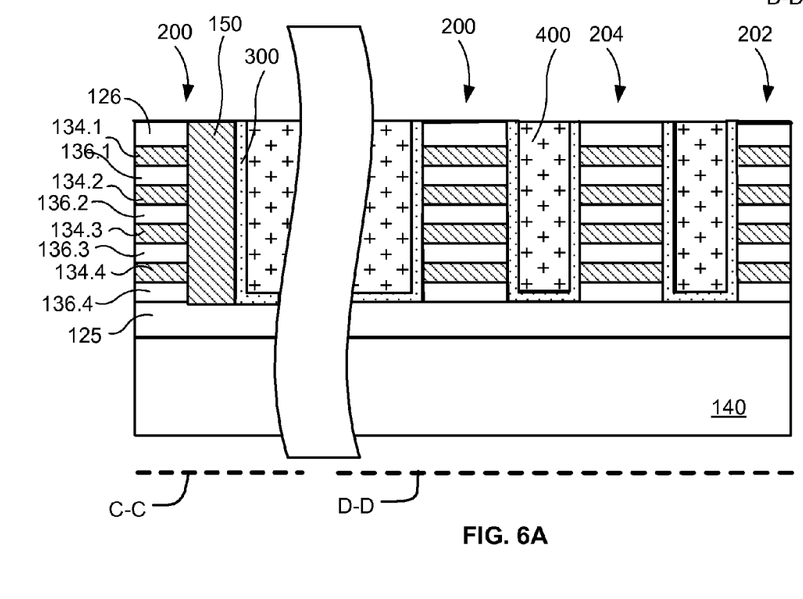
FIGS. 6A and 6B illustrate cross-sectional and top views of a structure following a sixth stage in a process for manufacturing a three-dimensional stacked memory device.
Figure 6B:
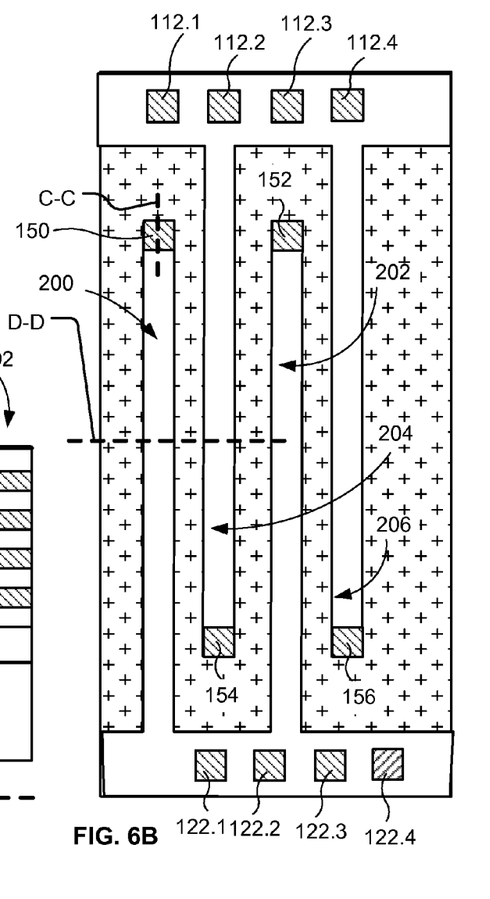

FIGS. 6A and 6B show the results after performing a planarization process to remove the exposed portions of the memory layer 300. The planaraization process exposes the top surfaces of the vertical connectors 150, 152, 154, 156 of the stacks 200, 202, 204, 206, and the top surfaces of the vertical connectors 112, 122. The planarization process may be for example Chemical Mechanical Polishing (CMP).

Figure 7A:
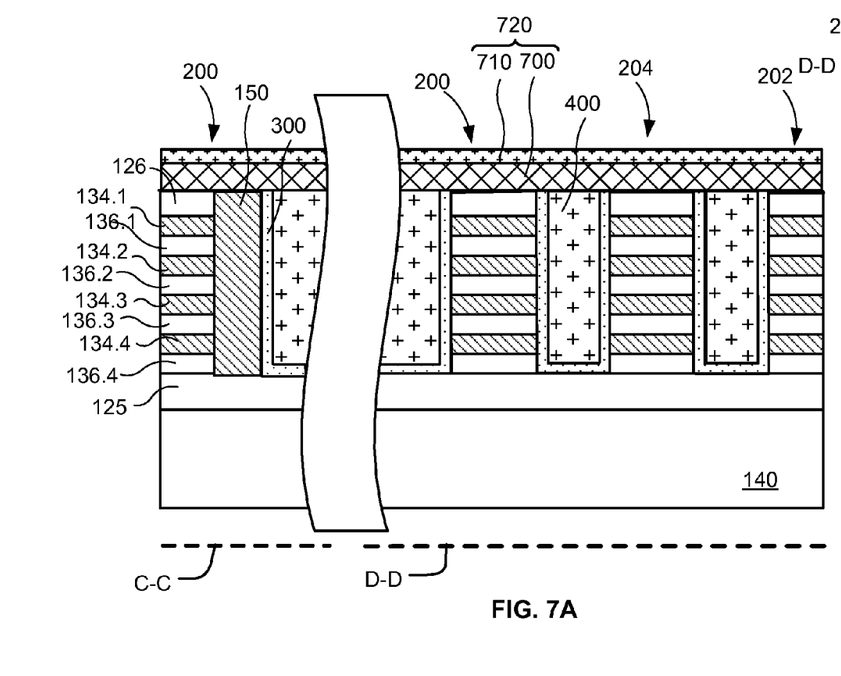
FIGS. 7A and 7B illustrate cross-sectional and top views of a structure following a seventh stage in a process for manufacturing a three-dimensional stacked memory device.
Figure 7B:
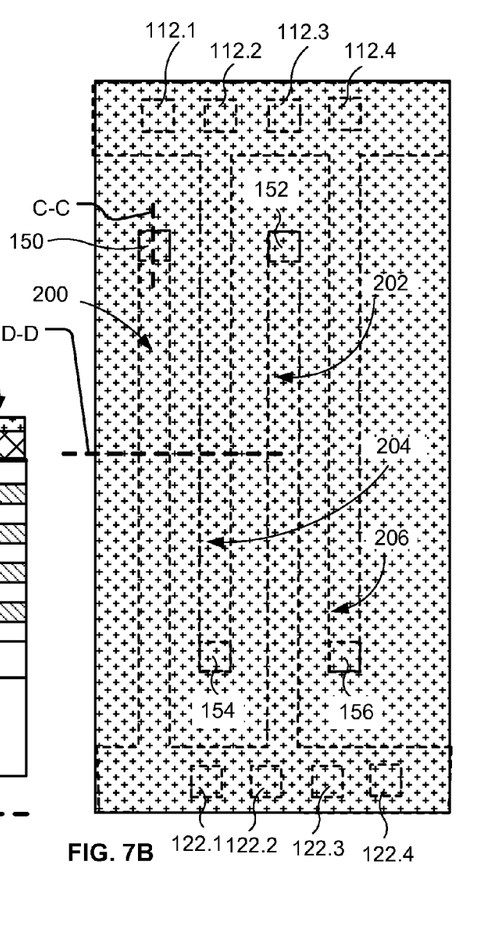

FIGS. 7A and 7B show the results of depositing a first layer 700 of conductive material on the structure in FIGS. 6A and 6B, followed by the deposition of a second layer 710 of conductive material to form a top gate material 720. In the illustrated example, the top gate material 720 is a multilayer structure. Alternatively, the top gate material 720 may be a single layer of material.

As described below, the top gate material 720 is used as upper portions of the conductive lines which will act as word lines for the device. In addition, the top gate material 720 is used as contact pads for the vertical connectors 150, 152, 154, 156, as well as contact pads for vertical connectors 112, 122 in the first and second first stepped connector structures 110, 120.

Figure 8A:
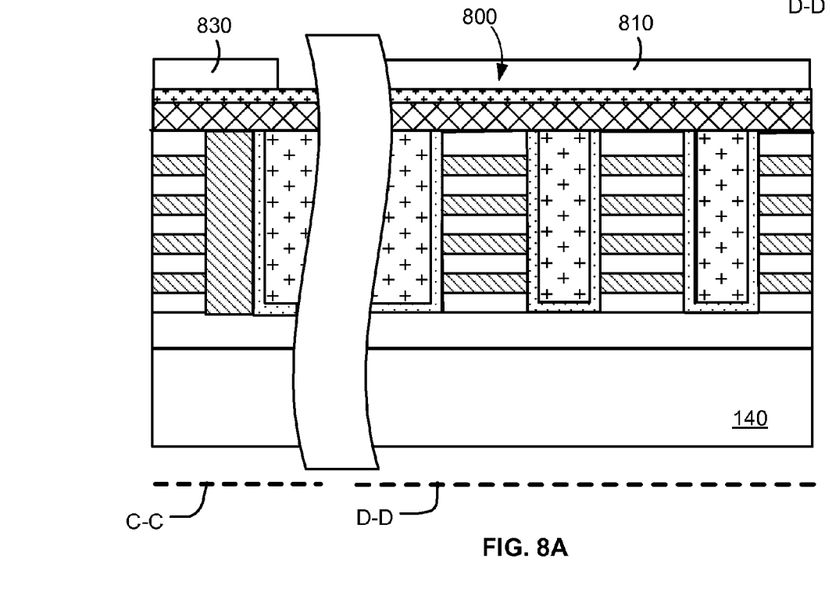
FIGS. 8A and 8B illustrate cross-sectional and top views of a structure following an eighth stage in a process for manufacturing a three-dimensional stacked memory device.
Figure 8B:
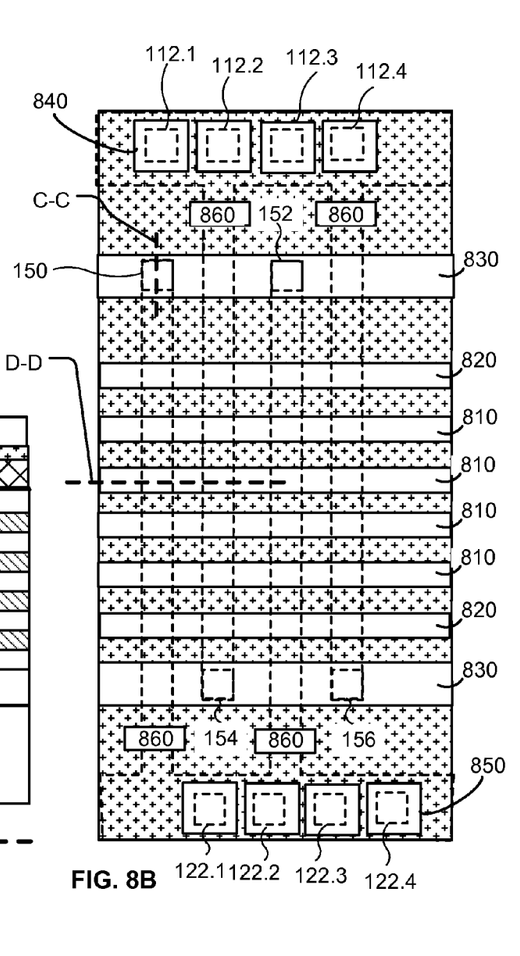

FIGS. 8A and 8B show the results of forming a patterned photoresist mask 800 on the structure in FIGS. 8A and 8B. The photoresist mask 800 includes lines 810 extending in parallel in a first direction. The lines 810 define the locations of the memory cells and the conductive lines which will act as word lines for the device.

The photoresist mask 800 also includes lines 820 extending in parallel in the first direction. The lines 820 define the locations of block select transistors and conductive lines which will act as ground select lines for the device.

The photoresist mask 800 also includes lines 830 extending in parallel in the first direction. The lines 830 define the locations of common source lines. As described in more detail below, the common source lines act as contact pads for the vertical connectors 150, 152, 154, 156. In alternative embodiments, rather than defining common source lines extending across the stacks, features defining the locations of individual contact pads may be patterned overlying each of the vertical connectors 150, 152, 154, 156.

The photoresist mask 800 also includes features 840 defining the locations of contact pads for the vertical connectors 112 in the first connector structure 110. The photoresist mask 800 also includes features 850 defining the locations of contact pads for the vertical connectors 122 in the second connector structure 120.

The photoresist mask 800 also includes features 860 defining the locations of string select transistors arranged at the second ends of the stacks.

Figure 9A:
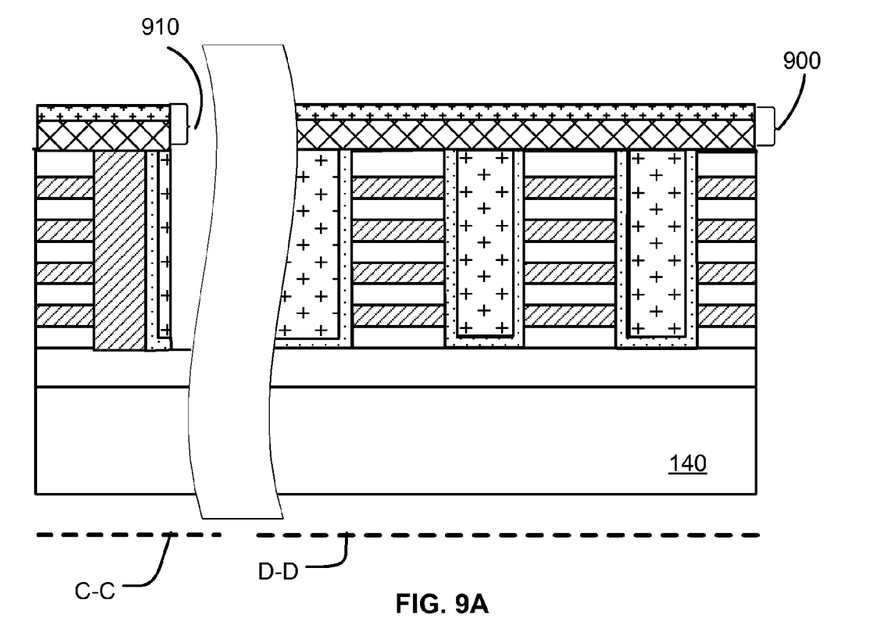
FIGS. 9A-9B and 9C illustrate cross-sectional and top views of a structure following a ninth stage in a process for manufacturing a three-dimensional stacked memory device.
Figure 9B:
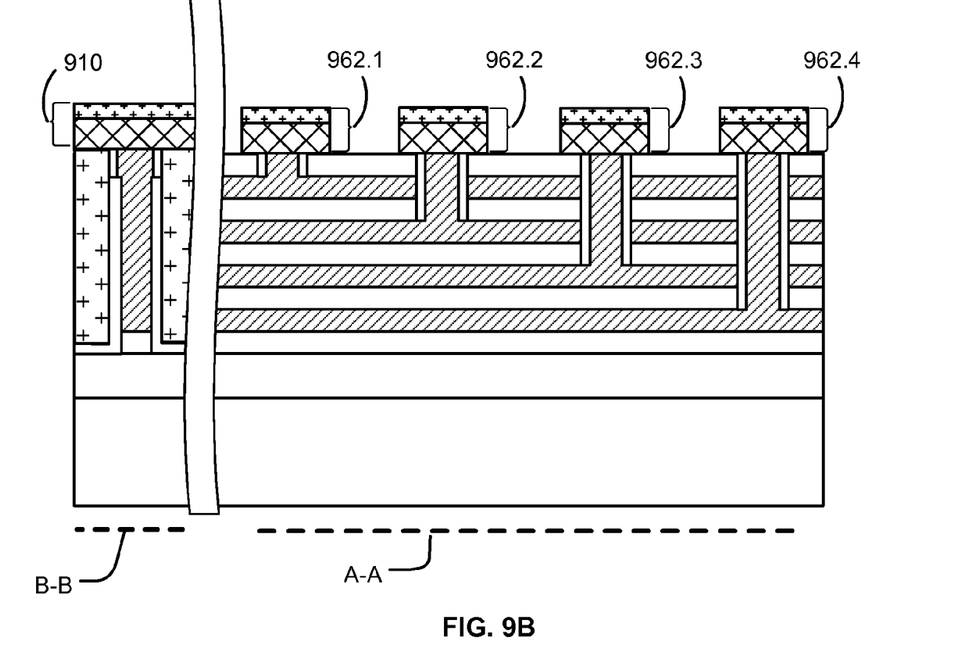
Figure 9C:
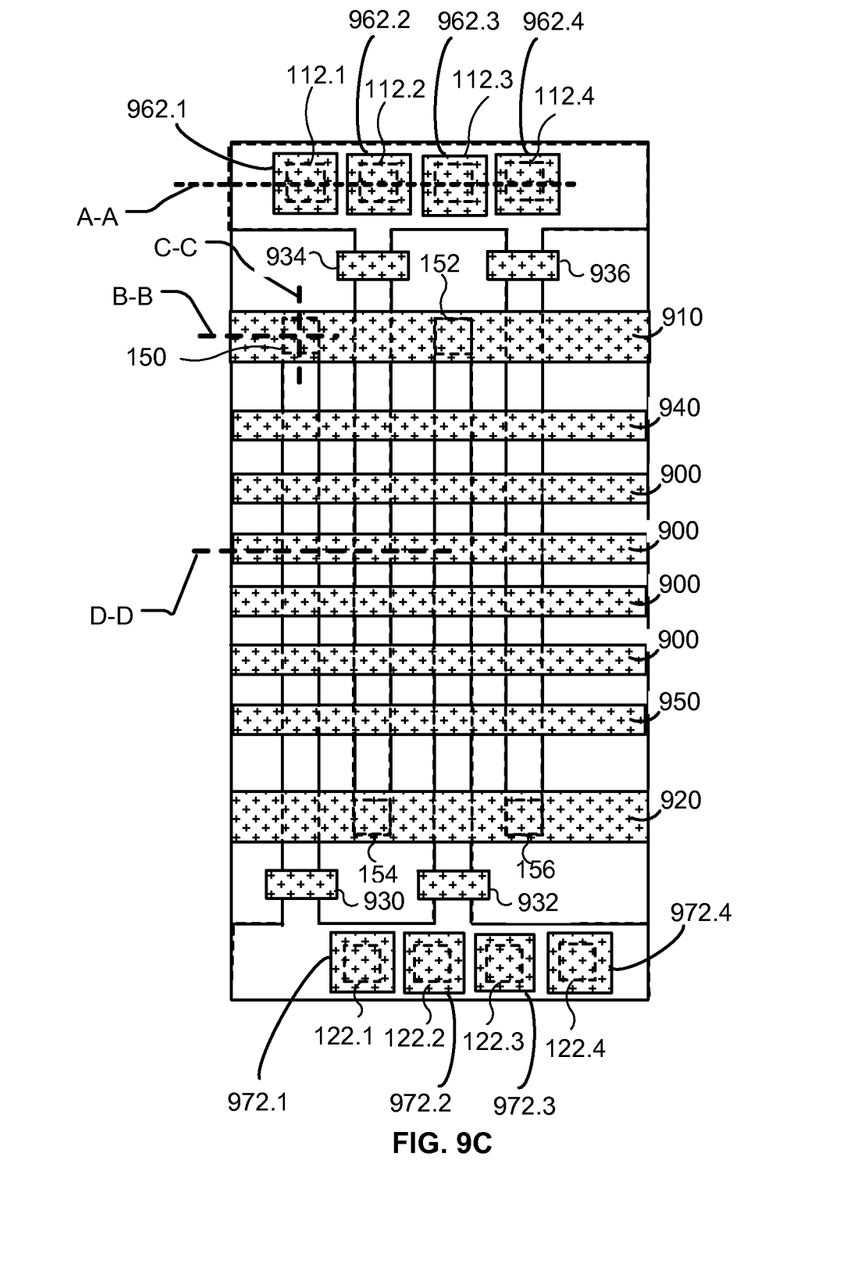

FIGS. 9A, 9B and 9C show the results of etching the structure shown in FIGS. 8A and 8B using the photoresist mask 800 as an etch mask, followed by removal of the photoresist mask 800. The etching utilizes the single photoresist mask 800, without etching through the ridge-shaped stacks. Polysilicon can be etched using an etch process that is highly selective for polysilicon, over silicon oxides and silicon nitrides, with the process stopping on the underlying dielectric layer 125.

The etching process forms a plurality of conductive lines 900 which act as word lines for the 3D memory array. The conductive lines 900 establish a 3D array of memory cells at cross-points between surfaces of the semiconductor strips of the stacks and the conductive lines 900. The memory cells in the semiconductor strips are arranged in NAND strings in this example. The memory cells have memory elements within portions of the memory layer 300 between the conductive lines 900 and the semiconductor strips acting as local bit lines. In this illustrated example, each memory cell is a double gate field effect transistor having active regions on both sides of the interface between the corresponding semiconductor strip and the conductive lines 900.

The etching process forms a first common source line 910 in contact with the top surfaces of the vertical connectors 150, 152 of the stacks 200, 202. The first common source line 910 acts as contact pads for the vertical connectors 150, 152.

The etching process also forms a second common source line 920 in contact with the top surfaces of the vertical connectors 154, 156 of the stacks 204, 206. The second common source line 920 acts as contact pads for the vertical connectors 154, 156.

The etching process also forms string-select transistors 930, 932, 934, 936 arranged at the second ends of the stacks 200, 202, 204, 206. The string-select transistors 930, 932 are used to selectively couple the semiconductor strips of the stacks 200, 202 to the corresponding vertical connectors 122. The string-select transistors 934, 936 are used to selectively couple the semiconductor strips of the stacks 204, 206 to the corresponding vertical connectors 112.

The etching process also forms a first set of block select transistors underlying a first ground select line structure 940. The etching process also forms a second set of block select transistors underlying a second ground select line structure 950.

The etching process also forms contact pads 962, labeled 962.1-962.4, for the vertical connectors 112. The etching process also forms contact pads 972, labeled 972.1-972.4, for the vertical connectors 122.

During the etching, the mask features and the subsequently formed contact pads protect the underlying vertical connectors 150, 152, 154, 156. If these mask features were not present, removing the relatively thick layer of polysilicon within the open region or trench adjacent to the vertical connectors may also completely etch away the memory layer covering the vertical connectors 150, 152, 154, 156, allowing part of the vertical connectors 150, 152, 154, 156 to also be etched away, which would effectively destroy the device.

Figures 10A, 10B:
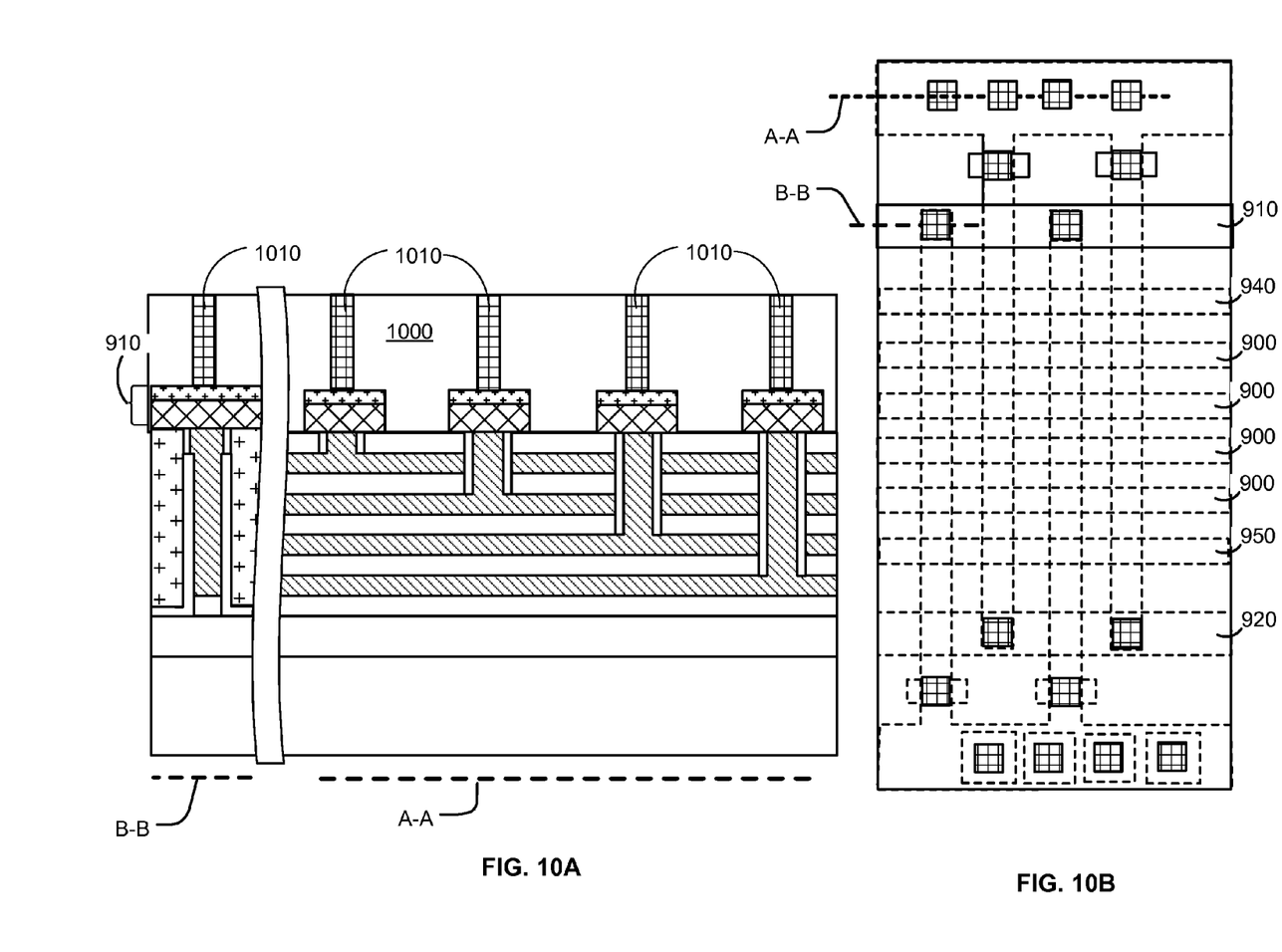
FIGS. 10A-10B illustrate cross-sectional and top views of a structure following a tenth stage in a process for manufacturing a three-dimensional stacked memory device.

A dielectric fill 1000 material is then deposited on the structure illustrated in FIGS. 9A-9C. A lithographic patterning step is then performed to form contact openings extending through the dielectric fill 1000 to expose contact surfaces of the contact pads 962, 972, the source lines 910, 920 and the string select transistors 930, 932, 934, 936. The contact openings are then filled with conductive material such as tungsten to form corresponding conductive contacts 1010. The resulting structure is illustrated in FIGS. 10A and 10B.

Additional back-end-of-line (BEOL) processing can then be performed to complete the 3D memory device. Generally, the structures formed by BEOL processes may include additional contacts, inter-layer dielectrics, and various metal layers for interconnections between the appropriate conductive contacts 1010 and access circuitry to couple the 3D array of memory cells to peripheral circuitry.

Figure 11:
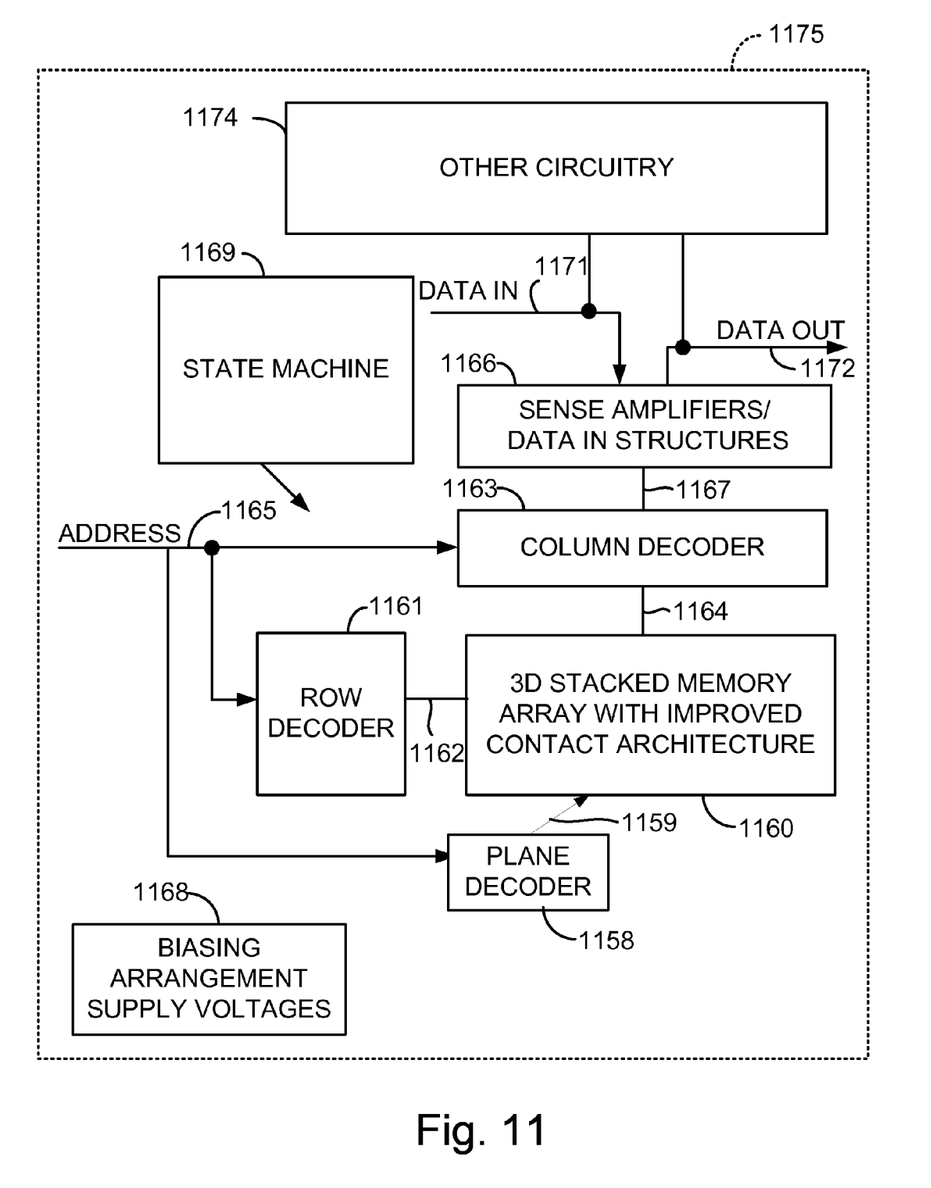
FIG. 11 is a simplified block diagram of an integrated circuit according to an embodiment of the present technology.

As a result of these processes, control circuits, biasing circuits, and decoder circuits, such as those shown in FIG. 11 can be formed. In some embodiments, the decoding layouts described in U.S. application Ser. No. 13/078,311 are utilized for the device, the disclosure of which is incorporated by reference herein.

FIG. 11 is a simplified block diagram of an integrated circuit 1175 according to an embodiment of the present technology. The integrated circuit 1175 includes a 3D staked memory array with an improved contact architecture manufactured as described herein. A row decoder 1161 is coupled to a plurality of word lines 1162, and arranged along rows in the memory array 1160. A column decoder 1163 is coupled to a plurality of string select lines 1164 for selecting columns in the memory array 1160 for reading and programming data from the memory cells in the array 1160. A plane decoder 1158 is coupled to a plurality of levels in the memory array 1160 via global bit lines 1159. The global bit lines 1159 are coupled to local bit lines (not shown) arranged along columns in the various levels of the memory array 1160. Addresses are supplied on bus 1165 to column decoder 1163, row decoder 1161 and plane decoder 1158. Sense amplifiers and data-in structures in block 1166 are coupled to the column decoder 1163 in this example via data bus 1167. Data is supplied via the data-in line 1171 from input/output ports on the integrated circuit 1175 or from other data sources internal or external to the integrated circuit 1175, to the data-in structures in block 1166. In the illustrated embodiment, other circuitry 1174 is included on the integrated circuit, such as a general purpose processor or special purpose application circuitry, or a combination of modules providing system-on-a-chip functionality supported by the array. Data is supplied via the data-out line 1172 from the sense amplifiers in block 1166 to input/output ports on the integrated circuit 1175, or to other data destinations internal or external to the integrated circuit 1175.

A controller implemented in this example using bias arrangement state machine 1169 controls the application of bias arrangement supply voltage generated or provided through the voltage supply or supplies in block 1168, such as read and program voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for manufacturing a memory device, the method comprising:
   forming a plurality of stacks of conductive strips separated by insulating material;
   forming vertical connectors interconnecting first ends of the conductive strips of respective stacks in the plurality of;
   forming a memory layer on surfaces of the conductive strips of the stacks;
   forming conductive material over the stacks and on top surfaces of the vertical connectors; and
   patterning the conductive material to form a plurality of conductive lines and form contact pads, the plurality of conductive lines extending across, and having surfaces conformal with, the plurality of stacks, such that a 3D array of interface regions is established at cross-points between surfaces of the conductive strips and the plurality of conductive lines, and the contact pads on the top surfaces of the vertical connectors, wherein the contact pads and conductive material of the conductive lines are part of the same patterned level of material, such that memory elements in the memory layer are defined in the interface regions, thereby establishing a 3D array of memory cells accessible via the plurality of conductive lines and the contact pads.

2. The method of claim 1, wherein:
   forming the memory layer includes forming the memory layer on top surfaces of upper insulating material layers of the stacks, and on top surfaces and exposed sidewalls of the vertical connectors; and
   forming and patterning the conductive material includes:
      forming a layer of first conductive material between adjacent stacks in the plurality of stacks;
      removing the portions of the memory layer to expose the top surfaces of the vertical connectors and the top surfaces of the stacks;
      depositing a layer of second conductive material on remaining portions of first conductive material and on the exposed top surfaces of the vertical connectors and the top surfaces of the stacks; and
   patterning the first and second conductive materials to form the plurality of lines and the contact pads.

3. The method of claim 2, wherein the first conductive material is different from the second conductive material.

4. The method of claim 1, wherein:
   forming the plurality of stacks of conductive strips exposes sidewalls of the vertical connectors;
   forming the memory layer includes forming the memory layer on the exposed sidewalls of the vertical connectors; and
   patterning the conductive material creates memory layer sidewall spacers on the sidewalls of the vertical connectors and in contact with bottom surfaces of the contact pads, the sidewall spacers separating the vertical connectors from remaining conductive material underlying the contact pads.

5. The method of claim 1, further comprising:
forming a dielectric fill material overlying the conductive lines and the contact pads;
forming contact openings within the dielectric fill material to expose contact surfaces of corresponding contact pads;
filling the contact openings with conductive material to form corresponding conductive contacts.

6. The method of claim 1, wherein forming the plurality of stacks includes forming conductive extensions in levels of the conductive strips, respective conductive extensions interconnecting second ends of the conductive strips within each particular level, and further comprising forming second vertical connectors contacting corresponding conductive extensions for each particular level and extending through openings in overlying levels.

7. The method of claim 6, wherein:
forming the conductive material includes forming the conductive material on top surfaces of the second vertical connectors; and
patterning the conductive material further forms second contact pads on top surfaces of the second vertical connectors.

8. The method of claim 7, further comprising:
forming a dielectric fill material overlying the conductive lines, the contact pads and the second contact pads;
forming contact openings within the dielectric fill material to expose contact surfaces of corresponding contact pads and of corresponding second contact pads; and
filling the contact openings with conductive material to form corresponding conductive contacts.

9. The method of claim 1, wherein forming the plurality of stacks of conductive strips includes forming a first set of stacks and forming a second set of stacks, the first and second sets arranged in an alternating fashion, so that adjacent stacks in the first set are separated by a single stack in the second set, and adjacent stacks in the second set are separated by a single stack in the first set, and the first ends of the conductive strips in the first set of stacks are opposite the first ends of the conductive strips in the second set.

10. The method of claim 1, wherein the memory layer comprises a layer of anti-fuse material.

11. The method of claim 1, wherein the memory layer includes a multilayer charge storage structure.

12. The method of claim 1, wherein the conductive strips comprise a doped semiconductor material so that the strips are arranged for operation of the memory cells as charge storage transistors.

13. The method of claim 1, wherein patterning the conductive material forms string select transistors arranged at second ends of the stacks.

14. A memory device comprising:
a plurality of stacks of conductive strips separated by insulating material;
vertical connectors interconnecting first ends of the conductive strips of respective stacks in the plurality of stacks;
a plurality of conductive lines extending across, and having surfaces conformal with, the plurality of stacks, such that a 3D array of interface regions is established at cross-points between surfaces of the conductive strips and the plurality of conductive lines;
contact pads on top surfaces of the vertical connectors, wherein the contact pads and conductive material of the conductive lines are part of the same patterned level of material; and
memory elements in the interface regions, which establish a 3D array of memory cells accessible via the plurality of conductive lines and the contact pads.

15. The memory device of claim 14, wherein the conductive lines comprise a first conductive material within trenches between adjacent stacks in the plurality of stacks, and a second conductive material extending across the stacks and on top surfaces of the first conductive material within the trenches.

16. The memory device of claim 15, wherein the first conductive material is different from the second conductive material.

17. The memory device of claim 14, further comprising sidewall spacers on sidewalls of the vertical connectors and in contact with bottom surfaces of the contact pads, the sidewall spacers separating the vertical connectors from remaining conductive material underlying the contact pads.

18. The memory device of claim 14, further comprising:
a dielectric fill overlying the conductive lines and the contact pads; and
conductive contacts extending from a top surface of the dielectric fill to contact corresponding conductive lines and contact pads.

19. The memory device of claim 14, further comprising:
conductive extensions in levels of the conductive strips, respective conductive extensions interconnecting second ends of the conductive strips within each particular level;
second vertical connectors contacting corresponding conductive extensions for each particular level and extending through openings in overlying levels; and
second contact pads on top surfaces of the second vertical connectors, wherein the second contact pads and conductive material of the conductive lines are part of the same patterned level of material.

20. The memory device of claim 19, further comprising:
a dielectric fill overlying the conductive lines, the contact pads and the second contact pads; and
conductive contacts extending from a top surface of the dielectric fill to contact corresponding contact pads and second contact pads.

21. The memory device of claim 14, wherein the plurality of stacks of conductive strips include a first set of stacks and a second set of stacks, the first and second sets arranged in an alternating fashion, so that adjacent stacks in the first set are separated by a single stack in the second set, and adjacent stacks in the second set are separated by a single stack in the first set, and the first ends of the conductive strips in the first set of stacks are opposite the first ends of the conductive strips in the second set.

22. The memory device of claim 21, further comprising:
a first interconnect region comprising first conductive extensions in levels of the conductive strips, respective first conductive extensions interconnecting second ends of the conductive strips of the first set of stacks within each particular level, and second vertical connectors contacting corresponding first conductive extensions for each particular level and extending through openings in overlying levels; and
a second interconnect region comprising second conductive extensions in levels of the conductive strips, respective second conductive extensions interconnecting second ends of the conductive strips of the second set of stacks within each particular level, and third vertical connectors contacting corresponding second conductive extensions for each particular level and extending through openings in overlying levels.

23. The memory device of claim 14, wherein the memory layer comprises a layer of anti-fuse material.

24. The memory device of claim 14, wherein the memory layer includes a multilayer charge storage structure.

25. The memory device of claim 14, wherein the conductive strips comprise a doped semiconductor material so that the strips are arranged for operation of the memory cells as charge storage transistors.

26. The memory device of claim 14, further comprising string select transistors arranged at second ends of the stacks, the string select transistors having gates with top surfaces co-planar with the top surfaces of the plurality of conductive lines.

\* \* \* \* \*